(12) United States Patent
Abraham

(10) Patent No.: US 7,026,673 B2
(45) Date of Patent: Apr. 11, 2006

(54) LOW MAGNETIZATION MATERIALS FOR HIGH PERFORMANCE MAGNETIC MEMORY DEVICES

(75) Inventor: David W. Abraham, Croton-on-Hudson, NY (US)

(73) Assignee: International Business Machines Corporation, Armonk, NY (US)

(*) Notice: Subject to any disclaimer, the term of this patent is extended or adjusted under 35 U.S.C. 154(b) by 120 days.

(21) Appl. No.: 10/733,676

(22) Filed: Dec. 11, 2003

(65) Prior Publication Data

US 2005/0127418 A1 Jun. 16, 2005

(51) Int. Cl.
- H01L 29/76 (2006.01)
- H01L 29/94 (2006.01)
- H01L 31/062 (2006.01)
- H01L 31/113 (2006.01)
- H01L 31/119 (2006.01)

(52) U.S. Cl. .......................... 257/295; 257/421
(58) Field of Classification Search ............ 257/295, 257/296, 310, 334, 421
See application file for complete search history.

(56) References Cited

U.S. PATENT DOCUMENTS

| | | | | |
|---|---|---|---|---|
| 6,111,783 A | * | 8/2000 | Tran et al. | 365/171 |
| 6,404,674 B1 | * | 6/2002 | Anthony et al. | 365/173 |
| 6,538,917 B1 | * | 3/2003 | Tran et al. | 365/158 |
| 6,538,920 B1 | * | 3/2003 | Sharma et al. | 365/171 |
| 6,683,815 B1 | * | 1/2004 | Chen et al. | 365/225.5 |

* cited by examiner

*Primary Examiner*—David Nhu
(74) *Attorney, Agent, or Firm*—Ryan, Mason & Lewis, LLP; Wan Yee Cheung, Esq.

(57) ABSTRACT

Techniques for attaining high performance magnetic memory devices are provided. In one aspect, a magnetic memory device having one or more free magnetic layers is provided. The one or more free magnetic layers have a low magnetization material adapted to have a saturation magnetization of less than or equal to about 600 electromagnetic units per cubic centimeter. The device may be configured such that a ratio of mean switching field associated with an array of non-interacting magnetic memory devices and a standard deviation of the switching field is greater than or equal to about 20. The magnetic memory device may have a magnetic random access memory (MRAM) device. A method of producing a magnetic memory device is also provided.

13 Claims, 3 Drawing Sheets

LOW MAGNETIZATION MATERIALS FOR HIGH PERFORMANCE MAGNETIC MEMORY DEVICES

FIELD OF THE INVENTION

The present invention relates to magnetic memory devices and, more particularly, to techniques for attaining high performance magnetic memory devices.

BACKGROUND OF THE INVENTION

In conventional magnetoresistive memory architectures, writing individual memory cells without also writing adjacent or other non-intended cells is a problem. Typically, writing a magnetic tunnel junction (MTJ) memory cell involves passing electrical currents simultaneously through a bit line (generally defined along a y axis) and a word line (generally defined along an x axis) at the intersection of which the intended MTJ cell resides. Thus, selected cells in a thin film magnetic random access memory (MRAM) are written by the coincidence of x-oriented and y-oriented magnetic fields. The selected MTJ cell will experience a magnetic field which is the vector sum of the magnetic fields created by the word and bit line currents. All other MTJ cells that share the same bit line or word line as the selected MTJ cell will be half-selected and thus will be subjected to either bit line or word line magnetic fields, respectively.

Certain factors, such as variations in the geometry (e.g., shape or size) of an MTJ cell, can give rise to variations in magnetic switching thresholds of the MTJ cells which are so large that it is virtually impossible to write a selected cell without also inadvertently switching some of the half-selected cells, thus placing the reliability and validity of the stored data in question. Increasing the thickness of layers within the cell can reduce, in part, some of the effects of these variations. However, an increase in thickness effects the switching properties of the cell, i.e., coercivity, such that the switching fields of the cell become inoperably large.

Therefore, magnetic memory devices are needed wherein the unwanted switching of half-selected cells is minimized or eliminated, while desired switching properties are retained.

SUMMARY OF THE INVENTION

The present invention provides techniques for attaining high performance magnetic memory devices. In one aspect of the invention, a magnetic memory device comprising one or more free magnetic layers is provided. The one or more free magnetic layers comprise a low magnetization material adapted to have a saturation magnetization of less than or equal to about 600 electromagnetic units per cubic centimeter. The device may be configured such that a ratio of mean switching field associated with an array of non-interacting magnetic memory devices and a standard deviation of the switching field is greater than or equal to about 20.

In another aspect of the invention, a method of producing a magnetic memory device comprises the following step. One or more free magnetic layers of the device are fabricated to comprise a low magnetization material adapted to have a saturation magnetization of less than or equal to about 600 electromagnetic units per cubic centimeter.

A more complete understanding of the present invention, as well as further features and advantages of the present invention, will be obtained by reference to the following detailed description and drawings.

DETAILED DESCRIPTION OF PREFERRED EMBODIMENTS

Figure 1:
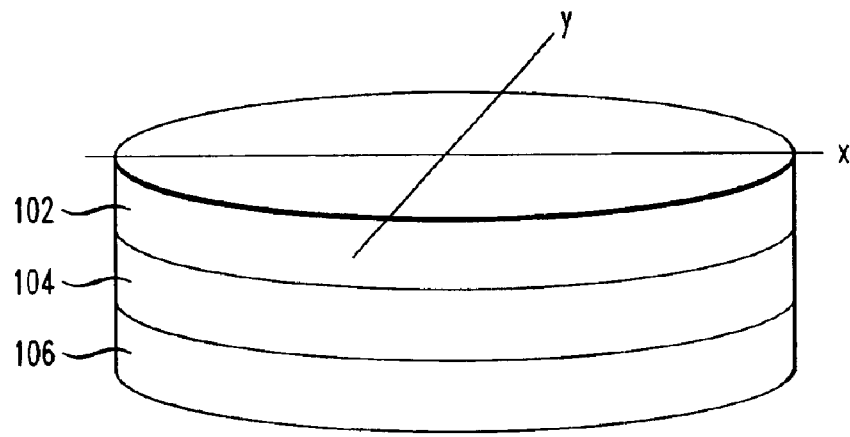
FIG. 1 is a diagram illustrating an exemplary magnetic memory device according to an embodiment of the present invention.

FIG. 1 is a diagram illustrating an exemplary magnetic memory device. In FIG. 1, magnetic memory device 100, which may be used, for example, as a magnetic storage element in a magnetic random access memory (MRAM) device, comprises magnetic layers 102 and 106 separated by a non-magnetic layer 104. In a typical magnetic memory device, e.g., magnetic memory device 100, one of magnetic layers 102 and 106 has a fixed magnetization (hereinafter referred to as the "fixed layer"), while the other of magnetic layers 102 and 106 has a variable magnetization that may be switched (hereinafter referred to as the "free layer" which may comprise one or more free magnetic layers and at least one non-magnetic layer between the one or more free magnetic layers). Magnetic memory device 100 may comprise, for example, a magnetic tunnel junction (MTJ) device.

Write yield in MRAM may be limited, in part, by a parameter which has been termed array quality factor (AQF). This AQF parameter, a measure of switching uniformity, is defined as the mean switching field of an array of non-interacting magnetic memory devices, for example, tunnel junction (TJ) devices, (e.g., measured along a long, easy axis of the device, e.g., the x axis in magnetic memory device 100) divided by the standard deviation of this switching field distribution, i.e., the coercivity (Hc) of each device divided by sigma Hc.

Figure 2:
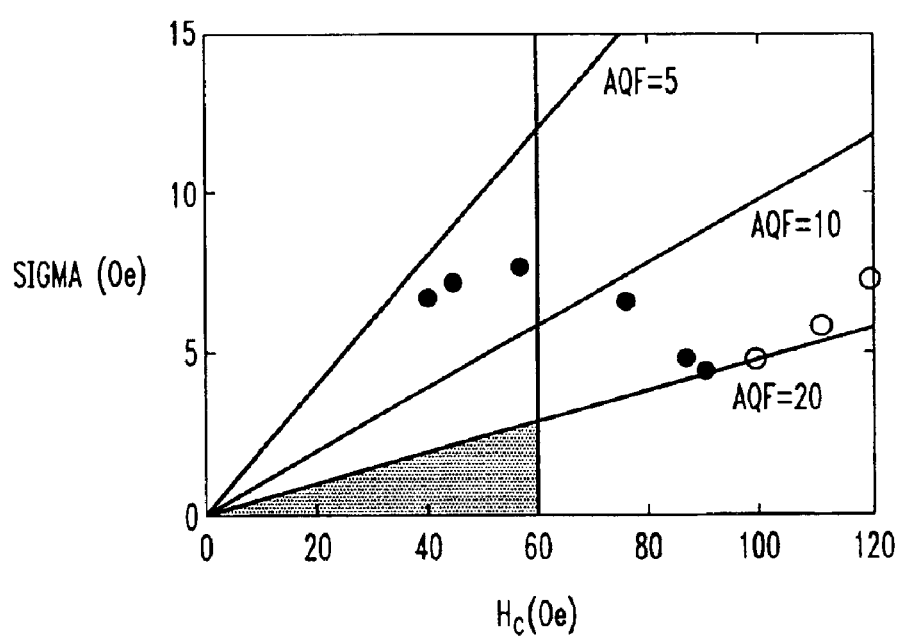
FIG. 2 is a graph illustrating the dependence of the array quality factor (AQF) of a magnetic memory device on the free layer thickness according to an embodiment of the present invention.

Magnetic memory device 100 having a high AQF, e.g., greater than or equal to about 20, is desirable. Achieving high AQF in patterned MRAM arrays is however limited, in part, by material effects. Specifically, as film thickness increases, the AQF is limited to a value determined by the patterning techniques employed (e.g., lithography and reactive ion etch (RIE)/milling/wet etching steps). This effect is shown in FIG. 2. FIG. 2 is a graph illustrating the dependence of the AQF of an exemplary magnetic memory device on the free layer thickness of the device. Specifically, FIG. 2 shows a plot of AQF for increasing magnetic film thicknesses. As shown in FIG. 2, the AQF reaches a peak value and is separated into three characteristic regions.

In the first region, the thin film limit occurs, in which material parameters limit the AQF. There is a rising AQF in this range of thicknesses. Next, in the second region, patterning quality limits AQF, and a value consistent with the uniformity of the shape of the magnetic memory device is observed as a maximum AQF value. Finally, in the third region, a thicker film limit is reached, at which point micromagnetic structures appear in the thicker magnetic film and the AQF starts to drop. The patterning limit of the second regime would be acceptable from a write yield perspective, in that typical AQF values for a two-to-one (2:1) aspect ratio device are typically around about 20 to about 30. Modeling suggests that such an AQF would be sufficient for a yielding device with millions of cells.

However, for typical materials such as Permalloy (Py) or cobalt-iron (CoFe) alloys, the film thicknesses at which this limiting AQF behavior occurs, e.g., a thickness of about six nanometers (nm), is such that a reasonably attainable switching field, as will be described in detail below, is not reasonably achievable. The reason for this is straightforward. Namely, the film surface is known to cause anisotropy fluctuations, and is likely to contribute to non-uniformity in other ways, such as by magnetization fluctuations.

The situation wherein anisotropy fluctuations are caused by the film surface may be modeled by saying that there is a disturbed surface region, characterized by a thickness $t_s$. It is suggested that $t_s$ is determined primarily by non-magnetic parameters, such as, but not limited to, growth layer roughness, and thus is material independent. The relative effect of this surface inhomogeneity on the MRAM device switching uniformity may thus be described by a ratio $t_s/t_{film}$, wherein $t_{film}$ is the physical thickness of the magnetic film.

For a given TJ shape, e.g., defined by the width and length of the device, the switching field is proportional to $Ms*t_{film}$, wherein Ms is the saturation magnetization. The saturation magnetization is variable, the value of which may be chosen depending on the particular materials used in the device, as will be described in detail below. Uniformity improves with larger $t_{film}$, since $t_s$ is essentially constant as film thickness increases.

Thus, to attain maximum uniformity at a given Hc, the Ms should be chosen to have a low value (e.g., less than or equal to about 600 electromagnetic units per cubic centimeter (emu/cc)) in order to maximize $t_{film}$, at a given reasonably attainable switching field, as described in detail below, while still providing a sufficient magnetoresistive signal. Namely, at a given reasonably attainable switching field, the film should be as thick as possible within the constraints that the device have an AQF of greater than or equal to about 20. This is attainable by lowering the Ms of the film, as described in detail below.

Magnetic memory device 100 is configured to operate at reasonably attainable switching fields. For example, magnetic memory device 100, may have a switching field of less than or equal to about 120 oersteds (Oe), e.g., magnetic memory device 100 may have a switching field of less than or equal to about 60 Oe. Thus, given a reasonably attainable switching field and maximized $t_{film}$ values, e.g., about eight nm, the Ms may then be tuned, as described in detail below.

Figure 3:
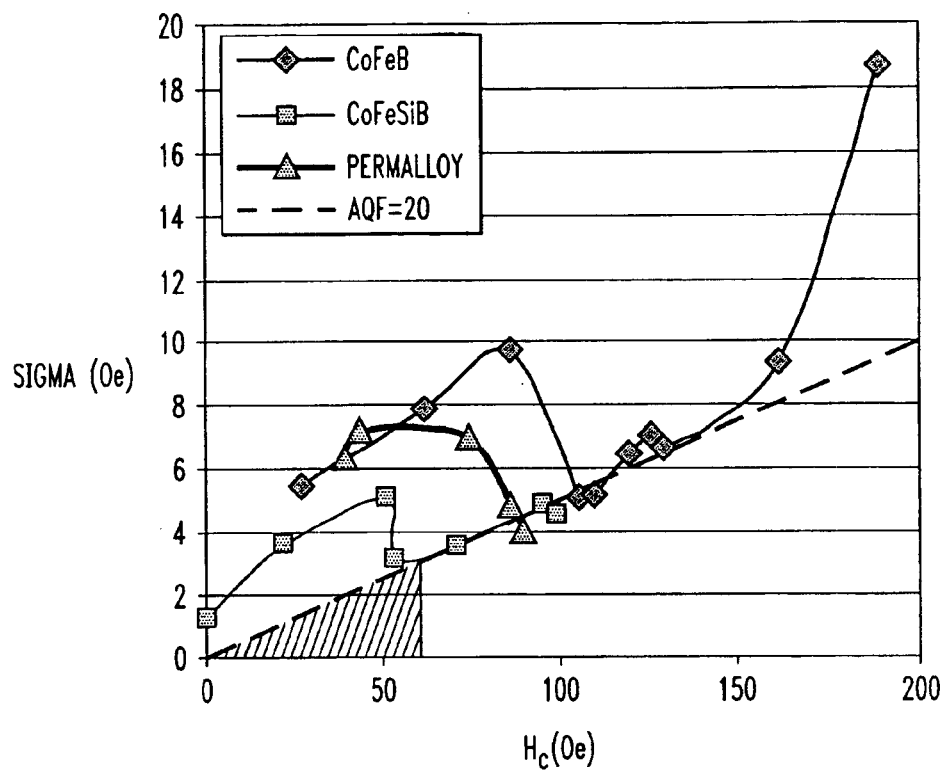
FIG. 3 is a graph illustrating the achievement of a high AQF with three different exemplary materials according to an embodiment of the present invention.

FIG. 3 is a graph illustrating the achievement of high AQF, e.g., AQF equal to 20, with three different exemplary materials, in accordance with an illustrative embodiment of the invention. The materials employed include a CoFeB material, a CoFeSiB material and a Py material. The graph in FIG. 3 shows that the high AQF limit is reached at different values of Hc, depending on the material employed.

Figure 4:
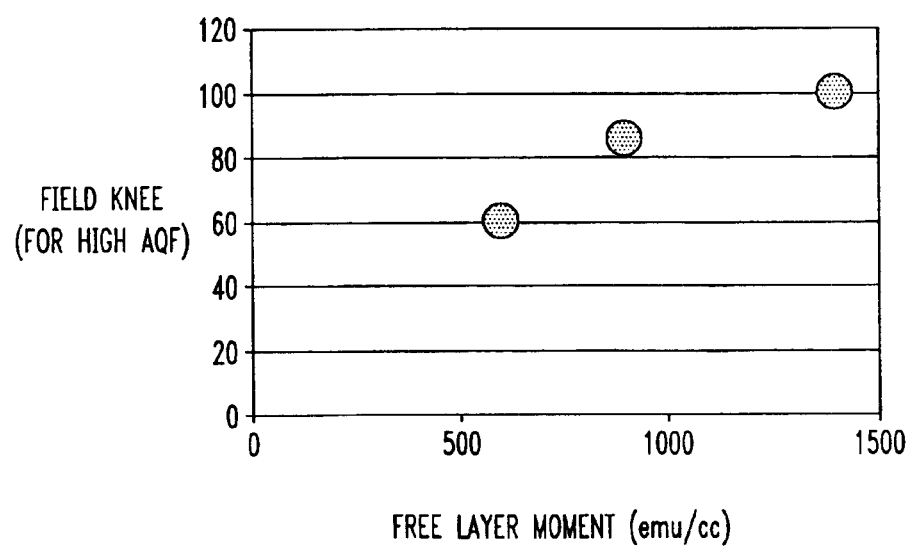
FIG. 4 is a graph illustrating the minimum magnetic field needed to reach a saturation value of AQF, versus sample magnetization according to an embodiment of the present invention.

FIG. 4 is a graph illustrating the minimum magnetic field needed to reach a saturation value of AQF versus sample magnetization, in accordance with an illustrative embodiment of the invention. Namely, FIG. 4 illustrates the relationship between the minimum Hc value at which high AQF is realized versus the material volume magnetization.

Low magnetization materials may be used for the magnetic memory devices of the present invention, such as MRAM devices, so that the uniformity of switching is maintained at high values, e.g., an AQF of greater than or equal to about 20, while the Hc is kept in a practical range, e.g., less than or equal to about 60 Oe. The term "low magnetization materials," as used herein, refers to materials having an Ms of less than or equal to about 600 electromagnetic units per cubic centimeter (emu/cc). For example, low magnetization materials include materials having an Ms of less than or equal to about 500 emu/cc.

Suitable materials for use with the present invention preferably maintain the desirable properties of conventional MRAM materials, including low anisotropy, e.g., less than or equal to about 20 Oe, and low magnetostriction, for example, less than or equal to about $1\times10^{-7}$, e.g., less than or equal to $1\times10^{-8}$, found in materials such as Py. The materials preferably also maintain sufficient magnetoresistance (MR) to provide an operable device, namely an MR typically in the range of greater than or equal to about ten percent.

The magnetic moment of the device is reduced by the inclusion of materials in the one or more free layers adapted to have an Ms of less than or equal to about 600 emu/cc. According to the techniques presented herein, the materials comprise an alloyed material, for example, a nickel-iron (NiFe) alloy. Adapting the materials to have a saturation magnetization of less than or equal to about 600 emu/cc may be achieved by including therein one or more moment-reducing elements. The one or more moment-reducing elements may include, but are not limited to, germanium, boron, vanadium, molybdenum, osmium and combinations comprising at least one of the foregoing materials.

Figure 5:
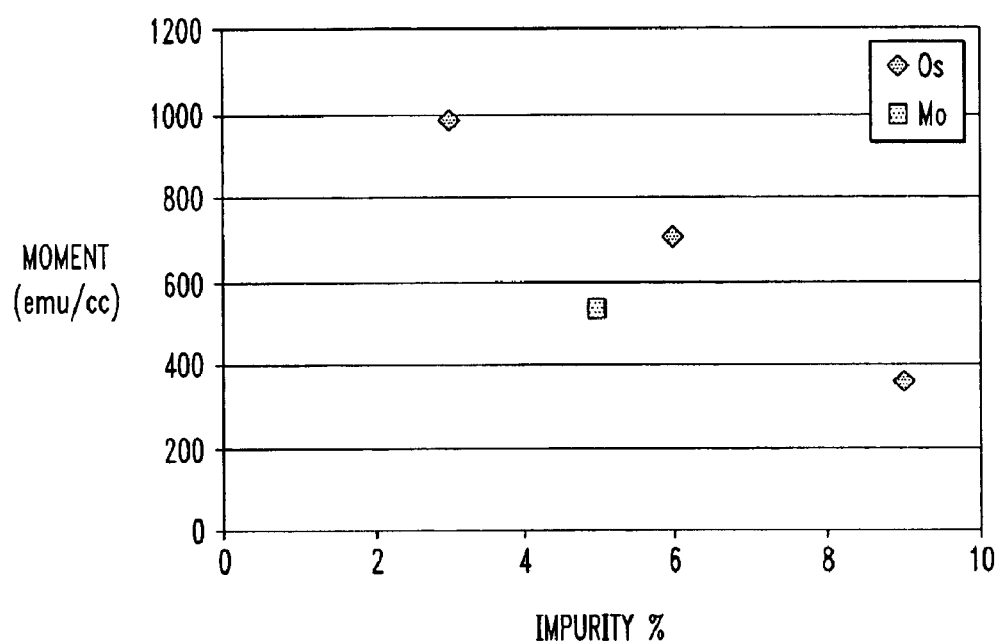
FIG. 5 is a graph illustrating the dependence of saturation magnetization of a material on the impurity content according to an embodiment of the present invention.

For example, the Ms of a NiFe alloy material may be reduced by the inclusion of molybdenum or osmium, as shown in FIG. 5. FIG. 5 is a graph illustrating the dependence of saturation magnetization of an exemplary material on the impurity content therein. The graph in FIG. 5 shows that the greater the impurity content, e.g., molybdenum or osmium, in the NiFe alloy material, the greater the reduction in Ms. Specifically, a molybdenum impurity content of about five percent, or an osmium impurity content of about nine percent are shown to reduce the Ms of the NiFe alloy material to below 600 emu/cc.

The use of high anisotropy materials with low moments, e.g., wherein anisotropy is greater than or equal to about 20 Oe and moment is below 600 emu/cc, may also be of value. In an embodiment wherein high anisotropy materials with low moments are used, thick films may be employed which improve switching fields. Further, a low aspect ratio may be used to reduce the switching field. For example, moving from an aspect ratio of two to 1.5 results in a 33 percent reduction in switching field. The combination of high anisotropy materials with low moments, thick films and low aspect ratios is particularly attractive for scaling operations. A preferred combination would be represented by an aspect ratio of between about one to about 1.3, a thick magnetic film (e.g., having a thickness of about ten nm), low magnetization (e.g., about 300 emu/cc) and moderate anisotropy (e.g., about 40 Oe).

Although illustrative embodiments of the present invention have been described herein, it is understood that the invention is not limited to those precise embodiments, and that various other changes and modifications may be made by one skilled in the art without departing from the scope or spirit of the invention.

What is claimed is:

1. A magnetic memory device comprising one or more free magnetic layers, the one or more free magnetic layers comprising a low magnetization material adapted to have a saturation magnetization of less than or equal to about 600 electromagnetic units per cubic centimeter.

2. The device of claim 1, configured such that a ratio of mean switching field associated with an array of non-interacting magnetic memory devices and a standard deviation of the switching field is greater than or equal to about 20.

3. The device of claim 1, further comprising at least one non-magnetic layer between the one or more free magnetic layers.

4. The device of claim 1, wherein the low magnetization material has a saturation magnetization of less than or equal to about 500 electromagnetic units per cubic centimeter.

5. The device of claim 2, wherein the ratio is dependent on a thickness of the one or more free magnetic layers.

6. The device of claim 1, wherein the one or more free layers exhibit an anisotropy of less than or equal to about 20 oersteds.

7. The device of claim 1, wherein the one or more free magnetic layers exhibit an anisotropy of greater than or equal to about 20 oersteds.

8. The device of claim 1, wherein the low magnetization material comprises a nickel-iron alloy.

9. The device of claim 1, wherein the low magnetization material is adapted to have a saturation magnetization of less than or equal to about 600 electromagnetic units per cubic centimeter by inclusion of a moment-reducing element into the low magnetization material.

10. The device of claim 9, wherein the moment-reducing element is selected from the group consisting of germanium, boron, vanadium, molybdenum, osmium and combinations comprising at least one of the foregoing elements.

11. The device of claim 1, having a switching field of less than or equal to about 120 oersteds.

12. The device of claim 1, having a switching field of less than or equal to about 60 oersteds.

13. An integrated circuit device including at least one magnetic memory device, the at least one magnetic memory device comprising one or more free magnetic layers, the one or more free magnetic layers comprising a low magnetization material adapted to have a saturation magnetization of less than or equal to about 600 electromagnetic units per cubic centimeter.

* * * * *